United States Patent [19]
Simon et al.
[11] Patent Number: 4,650,739
[45] Date of Patent: Mar. 17, 1987

[54] PROCESS FOR POST-TREATING ALUMINUM OXIDE LAYERS WITH AQUEOUS SOLUTIONS CONTAINING PHOSPHOROXO ANIONS IN THE MANUFACTURE OF OFFSET PRINTING PLATES WITH RADIATION SENSITIVE LAYER AND PRINTING PLATES THEREFOR

[75] Inventors: Ulrich Simon, Mainz; Reiner Beutel, Wiesbaden, both of Fed. Rep. of Germany

[73] Assignee: Hoechst Aktiengesellschaft, Frankfurt am Main, Fed. Rep. of Germany

[21] Appl. No.: 734,147

[22] Filed: May 15, 1985

[30] Foreign Application Priority Data

May 16, 1984 [DE] Fed. Rep. of Germany ....... 3418111

[51] Int. Cl.[4] ........................ G03C 1/94; G03C 1/54; G03F 7/08

[52] U.S. Cl. .................................... 430/161; 430/155; 430/157; 430/165; 430/166; 430/169; 430/175; 430/191; 430/276; 430/278; 204/17; 204/33; 204/58

[58] Field of Search ............... 430/276, 278, 157, 161, 430/165, 175, 169, 166, 191, 155; 204/17, 32 R, 33, 385, 58

[56] References Cited

U.S. PATENT DOCUMENTS

| | | | |
|---|---|---|---|
| 3,235,382 | 2/1966 | Neugebauer et al. | 430/175 |
| 3,236,646 | 2/1966 | Steppan et al. | 430/175 |
| 3,373,021 | 3/1968 | Adams et al. | 430/157 |
| 3,511,661 | 5/1970 | Rauner et al. | 96/86 |
| 3,679,419 | 7/1972 | Gilliol | 430/157 |
| 3,808,000 | 4/1974 | Magnotta et al. | 96/35 |
| 3,838,023 | 9/1974 | Friedemann et al. | 204/35 |
| 3,881,998 | 5/1975 | Miyosawa | 204/17 |
| 4,116,695 | 9/1978 | Mori et al. | 96/86 P |
| 4,153,461 | 5/1979 | Berghauser et al. | 430/161 |
| 4,175,964 | 11/1979 | Uchida et al. | 430/306 |
| 4,414,311 | 11/1983 | Walls et al. | 430/175 |
| 4,427,765 | 1/1984 | Mohr et al. | 430/278 |
| 4,554,057 | 11/1985 | Mohr | 204/33 |

FOREIGN PATENT DOCUMENTS

| | | |
|---|---|---|
| 83/0947 | 10/1983 | South Africa . |
| 1282944 | 7/1972 | United Kingdom . |
| 1410768 | 10/1975 | United Kingdom . |
| 1528834 | 10/1978 | United Kingdom . |

OTHER PUBLICATIONS

Patent Abstracts of Japan, "Surface Treatment of Tin Plated Steel", vol. 6, No. 149, (Aug. 10, 1982).

*Primary Examiner*—Charles L. Bowers, Jr.
*Attorney, Agent, or Firm*—Schwartz, Jeffery, Schwaab, Mack, Blumenthal & Evans

[57] ABSTRACT

A process for manufacturing materials in the form of sheets, foils or webs comprising chemically, mechanically and/or electrochemically roughened and anodically oxidized aluminum or one of its alloys, wherein the resultant aluminum oxide layers are post-treated with an aqueous solution containing phosphoroxo anions, is performed such that a post-treatment of the aluminum oxide layers is effected by immersion in an aqueous solution containing hexametaphosphate anion. In a preferred embodiment, the aqueous solution is adjusted to a pH of 1 to 5 by addition of an acid. The resulting materials, which have reduced adsorption properties, are preferably employed as support materials for offset printing plates.

16 Claims, No Drawings

PROCESS FOR POST-TREATING ALUMINUM OXIDE LAYERS WITH AQUEOUS SOLUTIONS CONTAINING PHOSPHOROXO ANIONS IN THE MANUFACTURE OF OFFSET PRINTING PLATES WITH RADIATION SENSITIVE LAYER AND PRINTING PLATES THEREFOR

BACKGROUND OF THE INVENTION

The present invention relates to a process for post-treating roughened and anodically oxidized aluminum, particularly support materials for offset printing plates, with aqueous solutions containing phosphoroxo anions.

Support materials for offset printing plates are provided, on one or both sides, with a radiation-sensitive (photosensitive) layer (reproduction layer), either directly by users or by manufacturers of precoated printing plates. This layer permits the production of a printing image of an original by photomechanical means. When a printing form is produced from the printing plate comprising such a reproduction layer, the layer support carries image areas which accept ink in the subsequent printing process. Concurrently, a hydrophilic image background for the lithographic printing operation is formed in the areas which are free from an image (non-image areas).

For the above reasons, the following requirements are demanded of a layer support for reproduction layers used in the manufacture of offset printing plates:

Those portions of the radiation-sensitive layer which have become comparatively more soluble following exposure must be capable of being easily removed from the support by a developing operation, in order to produce the hydrophilic non-image areas without leaving a residue.

The support, which has been laid bare in the non-image areas, must possess a high affinity for water, i.e., it must be strongly hydrophilic, in order to accept water rapidly and permanently during the lithographic printing operation, and to exert an adequate repelling effect with respect to the greasy printing ink.

The radiation-sensitive layer must exhibit an adequate degree of adhesion prior to exposure, and those portions of the layer which print must exhibit adequate adhesion following exposure.

The base material employed for layer supports of this type preferably comprises aluminum. The base material is superficially roughened using known methods, such as dry brushing, wet brushing, sandblasting, chemical and/or electrochemical treatment. The roughened substrate then is optionally subjected to an anodizing treatment, during which a thin oxide layer is built up, to improve abrasion resistance.

In practice, the support materials, particularly anodically oxidized support materials based on aluminum, are often subjected to a further treatment step before applying a radiation-sensitive layer. This treatment improves the adhesion of the layer, increases the hydrophilic properties of the support and/or improves the developability of the radiation-sensitive layer. Such treatments are, for example, carried out according to the following methods:

German Patent No. 16 71 614 (corresponding to U.S. Pat. No. 3,511,661) essentially describes an anodic oxidation of support materials for printing plates in an aqueous solution of $H_3PO_4$. In a comparative example (Example 12), a two-stage process variant is performed in which the support material is first anodically oxidized in an aqueous solution of $H_2SO_4$ and then is post-treated by immersion into an aqueous solution of $H_3PO_4$ or $Na_2HPO_4$. The patent document teaches that it is necessary to apply a layer of hydroxyethyl cellulose before applying the layer comprising a radiation-sensitive composition.

German Offenlegungsschrift No. 22 51 710 (corresponding to British Patent Specification No. 1,410,768) also discloses the non-electrolytic post-treatment, in an aqueous solution of $H_3PO_4$, of an aluminum support material for printing plates, the support material having been anodically oxidized in an aqueous solution of $H_2SO_4$. A similar process is described by U.S. Pat. No. 3,808,000.

In the process for producing a support material for printing plates according to German Patent No. 25 40 561 (corresponding to U.S. Pat. No. 4,116,695), immersion in an aqueous solution containing an acid (for example, meta-, pyro- or polyphosphoric acid) or a base (or example, $Na_3PO_4$ or $K_3PO_4$) is performed as an intermediate stage, prior to a treatment with steam or hot water and following a customary anodic oxidation of the aluminum (for example, in an aqueous solution of $H_2SO_4$).

In the two-stage process for the anodic oxidation of aluminum support materials for printing plates according to European Patent Application No. 0,086,957 (corresponding to South African Patent No. 83/0947), electrochemical treatment is performed (a) in an aqueous solution of $H_2SO_4$ and (b) in an aqueous solution comprising phosphorus-containing anions (phosphoroxo anions, phosphorofluro anions and/or phosphoroxofluoro anions). The following are mentioned as suitable compounds for step (b):

phosphoric acid ($H_3PO_4$):
sodium dihydrogen phosphate ($NaH_2PO_4$);
disodium hydrogen phosphate ($Na_2HPO_4$);
trisodium phosphate ($Na_3PO_4$);
phosphorous acid ($H_3PO_3$);
disodium phosphite ($Na_2HPO_3$);
diphosphoric acid ($H_4P_2O_7$);
sodium pyrophosphate ($Na_4P_2O_7$);
triphosphoric acid ($H_5P_3O_{10}$);
sodium triphosphate ($Na_5P_3O_{10}$);
polyphosphoric acid ($H_{n+2}P_nO_{3n+1}$);
hexasodium tetrapolyphosphate [$Na_6P_4O_{13}$];
hexasodium metaphosphate ($Na_6(PO_3)_6$);
disodium monofluorophosphate ($Na_2PO_3F$); and
potassium hexafluorophosphate ($KPF_6$).

It is true that these post-treatment processes often give satisfying results, but they cannot meet all of the increasingly stringent requirements made of a support material which is suitable for both the most up-to-date, practical applications and being coated with the most diverse radiation-sensitive reproduction layers. In particular, the known processes do not satisfy the requirements for an uncomplicated and inexpensive method for producing such a support material. This drawback to the known processes applies not only to the resistance to alkaline media, which is of particular importance when high-performance developers are used with positive-working, radiation-sensitive reproduction layers, but also to the adsorption characteristics of the oxide layers. The adsorption values are important, since staining (e.g., coloration) of the non-image areas, which most probably is caused by adsorptive effects, can occur, depending on the chemical composition of the reproduction layers.

For the industrial manufacture of these support materials in high-speed, high-performance installations, it is also desirable to develop a process for the post-treatment of oxide layers which can be performed in an energy-efficient manner, with the lowest possible malfunction rate. This means, for example, that an immersion treatment is generally preferred over an electrochemical treatment, if the respectively treated oxide layers exhibit comparable surface properties.

SUMMARY OF THE INVENTION

It is therefore an object of the present invention to provide a process for post-treating sheet-like aluminum, which can be performed in addition to an anodic oxidation of the aluminum, that results in an aluminum-based surface which meets the above-mentioned practical requirements demanded of a high-performance printing plate.

It is another object of the present invention to provide an offset printing plate comprising an aluminum-based substrate which displays little or no staining of non-image areas after developing.

In accomplishing the foregoing objects, there has been provided, in accordance with one aspect of the present invention, a process for manufacturing sheets, foils and webs comprised of aluminum or an aluminum alloy substrate, comprising the steps of (A) roughening and anodically oxidizing the substrate; and then (B) treating the substrate with an aqueous solution which contains an amount of hexametaphosphate anion sufficient to reduce dyestuff adsorption by the substrate.

In accordance with another aspect of the present invention, there has been provided an offset printing plate comprising a support and a radiation-sensitive reproduction layer provided thereon, which support comprises a sheet, foil or web manufactured according to the above-described process.

Other objects, features, and advantages of the present invention will become apparent from the following detailed description of preferred embodiments. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The hexametaphosphate anions of the present invention are derived from polymetaphosphoric acid $H_nP_nO_{3n}$, wherein n is equal to 6 (hexametaphosphoric acid). The anions can be obtained by dissolving a water-soluble salt of this acid, in particular an alkali metal salt, such as $Na_6P_6O_{18}$, in water. In a preferred embodiment of the present invention, this salt solution is adjusted to a pH of 1 to 5, in particular of 1.5 to 4.5, by means of an acid (for example, tartaric acid, citric acid or phosphoric acid), particularly a water-soluble organic acid (preferably a hydroxycarboxylic acid), such as citric acid. As a rule, the aqueous solution contains between about 1 g/l and 300 g/l, preferably 3 g/l to 150 g/l (more preferably 5 g/l to 100 g/l), of hexametaphosphate anions.

Post-treatment is performed non-electrolytically as an immersion treatment, either discontinuously or, preferably, continuously in modern web-processing apparatus. It is expedient to select treatment times of 0.5 to 120 seconds and treatment temperatures of 150° C. to 80° C., in particular of 20° C. to 75° C. By the process of the present invention, the surface topography (such as roughness and oxide pores) produced before immersion is practically unchanged, or is changed only insignificantly. Therefore, the process according to the present invention is particularly suited for treating materials for which maintaining the surface topography is of great importance, as is true, for example, in the case of support materials for printing plates.

Suitable base materials to be treated in accordance with the present invention include aluminum or one of its alloys which, for example, can have an Al content of more than 98.5% by weight and can additionally contain small amounts of Si, Fe, Ti, Cu and Zn. Especially if support materials for printing plates are to be produced, the sheet-like aluminum is first roughened, mechanically (e.g., brushing and/or treatment with an abrasive agent), chemically (e.g., etching agents) and/or electrochemically (e.g., a.c. treatment in aqueous acid or salt solutions), after an optional precleaning step. In the process according to the present invention, electrochemical roughening is preferred, but prior to the electrochemical treatment step, aluminum support materials can additionally be roughened by mechanical means (for example, by brushing with wire or nylon brushes and/or by treatment with an abrasive agent). All process steps can be carried out discontinuously using plates or foils, but preferably are performed continuously using webs.

Particularly in continuous processing, the process parameters for the electrochemical roughening step are normally within the following ranges: temperature of the aqueous electrolyte, which in particular contains 0.3 to 5.0% by weight of acid(s) (in the case of salts this content can be higher), 20° C. to 60° C.; current density, 3 to 200 A/dm$^2$; dwell time of a material spot to be roughened in the electrolyte, 3 to 100 seconds; and rate of flow of the electrolyte on the surface of the material to be roughened, 5 to 100 cm/s. In discontinuous processing, the required current densities tend to be in the lower region, and the dwell times in the upper region of the ranges indicated above, respectively, while the flow of the electrolyte can even be dispensed with. The type of current used is preferably ordinary alternating current having a frequency of 50 to 60 Hz, but it is also possible to use modified current types, such as alternating current having different current intensity amplitudes for the anodic and for the cathodic current, having lower frequencies, and having interruptions of current or superposition of two currents of different frequencies and wave shapes. The average peak-to-valley height ($R_z$) of the roughened surface is in a range from 1 to 15 μm, in particular from 1.5 to 8.0 μm. If the aqueous electrolyte contains acid(s), in particular HCl and/or $HNO_3$, aluminum ions in the form of aluminum salts, in particular Al $(NO_3)_3$ and/or $AlCl_3$, can also be added. It is also known to add certain other acids and salts, such as boric acid or borates, and to add corrosion-inhibiting substances, such as amines.

Precleaning includes, for example, treatment with an aqueous NaOH solution with or without a degreasing agent and/or complex formers, trichloroethylene, acetone, methanol or other commercially available substances known as aluminum treatment agents. After roughening or, in the case of several roughening steps, between the individual steps, it is possible to perform an additional etching treatment, during which in particular a maximum amount of 2 $g/m^2$ is removed (between the individual steps, up to 5 $g/m^2$). Etching solutions in general are aqueous alkali metal hydroxide solutions or aqueous solutions of salts showing alkaline reactions or aqueous solutions of acids based on $HNO_3$, $H_2SO_4$ and $H_3PO_4$, respectively. Apart from an etching treatment step, performed between the roughening step and a subsequent anodizing step, there are also known non-electrochemical treatments which have what is essentially a purely rinsing and/or cleaning effect. These non-electrochemical treatments are employed, for example, to remove deposits formed during roughening ("smut"), or simply to remove electrolyte remainders; for example, dilute aqueous alkali metal hydroxide solutions or water can be used for these treatments.

The electrochemical roughening is followed by an anodic oxidation of the aluminum, in a further process step to improve, for example, the abrasion and adhesion properties of the surface of the support material. Conventional electrolytes, such as $H_2SO_4$, $H_3PO_4$, $H_2C_2O_4$, amidosulfonic acid, sulfosuccinic acid, sulfosalicylic acid or mixtures thereof, may be used for the anodic oxidation. Particular preference is given to $H_2SO_4$ and $H_3PO_4$, which may be used alone or in a mixture and/or in a multi-stage anodizing process. Most preferably, an aqueous solution containing $H_2SO_4$ and $Al^{3+}$ ions is employed. Usually, the oxide layer weights range from about 1 to 8 $g/m^2$ (corresponding to layer thicknesses between about 0.3 and 2.5 $\mu m$).

The materials prepared in accordance with the present invention are preferably used as supports for offset printing plates, i.e., at least one surface of the support material is coated with a radiation-sensitive composition, either by the manufacturers of presensitized printing plates or directly by the users. Radiation-sensitive (photosensitive) layers basically include all layers which after irradiation (exposure), if appropriate followed by development and/or fixing, yield a surface in imagewise configuration which can be used for printing.

Apart from the silver halide-containing layers used for many applications, various other layers are known which are described, for example, in *Light-Sensitive Systems*, by Jaromir Kosar (John Wiley & Sons, New York, 1965): colloid layers containing chromates and dichromates (Kosar, Chapter 2); layers containing unsaturated compounds, which, upon exposure of the layer, are isomerized, rearranged, cyclized, or cross-linked (Kosar, Chapter 4); layers containing compounds which can be photopolymerized, in which, on being exposed, monomers or prepolymers undergo polymerization, optionally with the aid of an intiator (Kosar, Chapter 5); and layers containing o-diazoquinones, such as naphthoquinone diazides, p-diazoquinones or condensation products of diazonium salts (Kosar, Chapter 7).

Layers which are suitable for the present invention also include electrophotographic layers, i.e., layers which contain an inorganic or organic photoconductor. In addition to photosensitive substances, these layers can, of course, also contain other constituents, such as resins, dyes and plasticizers. In particular, the following photosensitive compositions or compounds can be employed in the coating of the support materials prepared in accordance with the present invention:

Positive-working reproduction layers which contain, as the light-sensitive compounds, o-quinone diazides, preferably o-naphthoquinone diazides, such as high or low molecular-weight naphthoguinone-(1,2)-diazide-(2)-sulfonic acid esters and amides, which are described, for example in German Patents Nos. 854,890, 865,109, 879,203, 894,959, 938,233, 1,109,521, 1,144,705, 1,118,606, 1,120,273, 1,124,817, and 2,331,377; and in European Patent Application Nos. 0,021,428 and 0,055,814.

Negative-working reproduction layers which contain condensation products from aromatic diazonium salts and compounds with active carbonyl groups, preferably condensation products formed from diphenylaminediazonium salts and formaldehyde, as described, for example, in German Patents Nos. 596,731, 1,138,399, 1,138,400, 1,138,401, 1,142,871 and 1,154,123; in U.S. Pat. Nos. 2,679,498 and 3,050,502; and in British Patent Specification No. 712,606.

Negative-working reproduction layers which contain condensation products of aromatic diazonium compounds, such as described in German Patent No. 20 65 732, which comprise products possessing at least one unit each of (a) an aromatic diazonium salt compound capable of participating in a condensation reaction and (b) another compound that is also able to participate in a condensation reaction, such as a phenol ether or an aromatic thioether, which units are connected by a bivalent linking member derived from a carbonyl compound such as a methylene group, capable of participating in a condensation reaction group.

Positive-working layers according to German Offenlegungsschriften Nos. 26 10 842 and 29 28 636, and German Patent No. 27 18 254, which contain (a) a compound that, on being irradiated, splits off an acid, (b) a monomeric or polymeric compound possessing at least one C-O-C group which can be split off by acid (e.g., an orthocarboxylic acid ester group or a carboxylic acid amide acetal group), and if appropriate, (c) a binder.

Negative-working layers, composed of photopolymerizable monomers, photoinitiators, binders and, if appropriate, further additives. In these layers, acrylic and methacrylic acid esters, or reaction products of dissocyanates with partial esters of polyhydric alcohols are, for example, employed as monomers, as described, for example, in U.S. Pat. Nos. 2,760,863 and 3,060,023, and in German Offenlegungsschriften No. 20 64 079 and 23 61 041.

Negative-working layers according to German Offenlegungsschrift No. 30 36 077, which contain, as the photo-sensitive compound, a diazonium salt polycondensation product or an organic azido compound, and, as the binder, a high-molecular weight polymer with alkenylsulfonylurethane or cycloalkenylsulfonylurethane side groups.

It is also possible to apply photosemiconducting layers to the support materials prepared in accordance with the present invention, such as are described, for example, in German Pat. Nos. 11 17 391, 15 22 497, 15 72 312, 23 22 046, and 23 22 047, to obtain highly photosensitive electrophotographic printing plates.

From the coated offset printing plates prepared using the support materials produced in accordance with the present invention, the desired printing forms are obtained in a known manner, by imagewise exposure or irradiation and subsequent washing out of the non-image areas by means of a developer, preferably an aqueous developer solution.

Surprisingly, offset printing plates produced with base materials post-treated according to the process of the present invention are distinguished, in comparison with those plates for which the same base material has been post-treated with other aqueous solutions containing phosphoroxo anions, by a reduced tendency to staining (see Comparative Examples below). This special effect of the hexametaphosphate anions in a pure immersion treatment was not foreseeable, because in an electrochemical treatment the whole group of anions generally has a similar effect.

In the preceding description and in the examples which follow, percentages always denote percentages by weight, unless otherwise indicated. Parts by weight are related to parts by volume as g is related to $cm^3$. Moreover, the following methods were used in the examples for the determination of parameters.

In order to examine whether the surface exhibits dyestuff adsorption (staining) properties, a cut piece of plate material which has been coated with a radiation-sensitive layer is exposed and developed, and then one half of it is treated with a deletion fluid. The greater the difference is in the color values between the untreated and the treated half, the more dyestuff was adsorbed on the untreated portion of the surface of the support material. The dyestuff adsorption values range from 0 to 5, 0 denoting no dyestuff adsorption, 1 denoting slight dyestuff adsorption and 5 denoting strong dyestuff adsorption; only half steps are indicated. Values above 5 indicate that, additionally, the oxide layer has been removed.

Suitable radiation-sensitive layers, which are applied to the support material, include (A) a negative-working layer containing (i) a reaction product of polyvinyl butyral and propenylsulfonylisocyanate, (ii) a polycondensation product obtained from 1 mol of 3-methoxy-diphenylamine-4-diazonium sulfate and 1 mol of 4,4'-bismethoxymethyl diphenyl ether, precipitated as the mesitylene sulfonate, (iii) $H_3PO_4$, (iv) Viktoria Pure Blue FGA and (v) phenylazo-diphenylamine; and (B) a positive-working layer containing (i) a cresol/formaldehyde novolak, (ii) a 4-(2-phenylprop-2-yl)-phenyl ester of naphthoquinone-(1,2)-diazide-(2)-sulfonic acid-(4), (iii) polyvinyl butyral, (iv) naphthoquinone-(1,2)-diazide-(2)-sulfonic acid chloride-(4) and (v) crystal violet. Printing plates and printing forms which are suited for practical use are produced in this way.

EXAMPLE 1 AND COMPARATIVE EXAMPLE C1

In an aqueous solution containing 1.4% of $HNO_3$ and 6% of $Al(NO_3)_3$, an aluminum web was electrochemically roughened, using alternating current (115 A/$dm^2$ at 35° C.), and was then anodically oxidized, using direct current, in an aqueous solution containing $H_2SO_4$ and $Al^{3+}$ ions.

The resulting layer, which had a weight of about 2.5 g/$m^2$, was immersed into an aqueous solution containing hexasodium-hexametaphosphate ($Na_6P_6O_{18}$) and having a pH of 7, at a temperature of 45° C. to 50° C. for a period of 15 seconds. The changes in dyestuff adsorption associated with increasing amounts of this salt are compiled in a table below.

The Comparative Example (C1) was performed as described above for Example 1, but without a post-treatment.

EXAMPLE 2 AND COMPARATIVE EXAMPLE C2

The procedure of Example 1 was followed, except that an aqueous solution containing 0.9% of HCl was used.

EXAMPLE 3 AND COMPARATIVE EXAMPLE C3

The procedure followed was the same as in Example 1, except that the solution of $Na_6P_6O_{18}$ additionally contained 10 g/l of citric acid, and thus had a pH of 2.5.

EXAMPLE 4 AND COMPARATIVE EXAMPLE C4

The procedure followed was the same as in Example 2, except that the solution of $Na_6P_6O_{18}$ additionally contained 10 g/l of citric acid, and thus had a pH of 2.5.

EXAMPLE 5 AND COMPARATIVE EXAMPLE C20

The procedure followed was the same as in Example 1 (C5 to C12) or Example 2 (C13 to C20), except that other compounds which also yield phosphoroxo anions (see Table) were used, or that no post-treatment was performed, respectively.

The tabulated data show that, with two conventional electrochemical roughening methods, the dyestuff adsorption was more significantly reduced when hexasodiumhexametaphosphate was used than when other salts or acids which yield phosphoroxo anions were employed. The effect was even more pronounced when the pH was changed, for example, by adding citric acid; a similar effect was observed in a pH range of 1 to 5, when other, less strong, acids were added.

TABLE

| Example or Comparative Example | Electrolyte | Dyestuff adsorption of oxide layer when an electrolyte of the following concentration (g/l) is used | | | | | |
|---|---|---|---|---|---|---|---|
| | | 0 | 1 | 5 | 10 | 20 | 100 |
| Cl | — | 4 | — | — | — | — | — |
| 1 | $Na_6P_6O_{18}$ | — | 3 | 2 | 2 | 1.5 | 1 |
| C2 | — | 5 | — | — | — | — | — |
| 2 | $Na_6P_6O_{18}$ | — | 4.5 | 4 | 3.5 | 3.5 | 3.5 |
| C3 | — | 3 | — | — | — | — | — |
| 3 | $Na_6P_6O_{18}$ + citric acid | — | 1.5 | 1 | 1 | 1 | 1 |
| C4 | — | 4 | — | — | — | — | — |
| 4 | $Na_6P_6O_{18}$ + citric acid | — | 2 | 1.5 | 1 | 1.5 | 1.5 |
| C5 | — | 3.5 | — | — | — | — | — |
| | $H_3PO_4$ (85%) | — | 3 | 3 | 2.5 | 3.5 | 3 |
| C6 | — | 3.5 | — | — | — | — | — |
| | $Na_3PO_4$ | — | 3.5 | 4.5 | 6 | 8 | 16 |
| C7 | — | 4 | — | — | — | — | — |
| | $NaH_2PO_4$ | — | 4 | 3.5 | 4 | 3.5 | 3.5 |
| C8 | — | 4 | — | — | — | — | — |
| | $Na_6P_4O_{13}$ | — | 3.5 | 3 | 3 | 2.5 | 2.5 |
| C9 | — | 4.5 | — | — | — | — | — |
| | $Na_2HPO_4$ | — | 4.5 | 5.5 | 5 | 4.5 | 6 |
| C10 | — | 3.5 | — | — | — | — | — |
| | $KPF_6$ | — | 3.5 | 3.5 | 3.5 | 3 | 4 |
| C11 | — | 4 | — | — | — | — | — |
| | $H_4P_2O_7$ | — | 3 | 2,5 | 2 | 2 | 2 |
| C12 | — | 4.5 | — | — | — | — | — |
| | $Na_4P_2O_7$ | — | 4.5 | 4 | 3.5 | 4 | 4 |
| C13 | — | 4.5 | — | — | — | — | — |
| | $H_3PO_4$ (85%) | — | 4 | 5 | 5.5 | 7 | 9 |
| C14 | — | 5 | — | — | — | — | — |
| | $Na_3PO_4$ | — | 6 | 8 | 9 | 11 | 20 |
| C15 | — | 5 | — | — | — | — | — |
| | $NaH_2PO_4$ | — | 4.5 | 4.5 | 4.5 | 4 | 3.5 |
| C16 | — | 5 | — | — | — | — | — |
| | $Na_6P_4O_{13}$ | — | 4.5 | 4 | 4.5 | 4.5 | 4 |

TABLE-continued

| Example or Comparative Example | Electrolyte | Dyestuff adsorption of oxide layer when an electrolyte of the following concentration (g/l) is used | | | | | |
|---|---|---|---|---|---|---|---|
| | | 0 | 1 | 5 | 10 | 20 | 100 |
| C17 | — | 5.5 | — | — | — | — | — |
| | $Na_2HPO_4$ | — | 5 | 5 | 4 | 5 | 4.5 |
| C18 | — | 4 | — | — | — | — | — |
| | $KPF_6$ | — | 4.5 | 4 | 4 | 3.5 | 4.5 |
| C19 | — | 5 | — | — | — | — | — |
| | $H_4P_2O_7$ | — | 4.5 | 4.5 | 5 | 5 | 5.5 |
| C20 | — | 5 | | | | | |
| | $Na_4P_2O_7$ | — | 5.5 | 4.5 | 4.5 | 4.5 | 4.5 |

What is claimed is:

1. An offset printing plate comprising a support and a radiation-sensitive reproduction layer provided on said support, said support comprising a sheet, foil or web comprised of an aluminum or aluminum alloy substrate which is the product of a process comprising the steps of:

(A) roughening said substrate mechanically, chemically and/or electrochemically;

(b) anodically oxidizing said substrate; and then (c) subjecting said substrate to a nonelectrolytic immersion treatment in an aqueous solution which contains between about 3 g/l and 150 g/l of sodium hexametaphosphate and an amount of a water-soluble hydroxycarboxylic acid such that said aqueous solution has a pH of between about 1 and 5, said support showing reduced dyestuff adsorption when said radiation-sensitive layer is imagewise exposed and developed.

2. An offset printing plate as claimed in claim 1, wherein said acid comprises a citric or tartaric acid.

3. An offset printing plate as claimed in claim 2, wherein said acid comprises a citric acid.

4. An offset printing plate as claimed in claim 1, wherein said radiation-sensitive layer is a positive-working or a negative-working reproduction layer.

5. An offset printing plate as claimed in claim 4, wherein said reproduction layer is comprised of an admixture selected from the group consisting of (a) an admixture containing (i) a reaction product of polyvinylbutyral and propenylsulfonylisocyanate, (ii) a polycondensation product obtained from 1 mol of 3-methoxydiphenylamine-4-diazonium sulfate and 1 mol of 4,4'-bismethoxymethyl diphenyl ether, precipitated as the mesitylene sulfonate, (iii) $H_3PO_4$, (iv) Viktoria Pure Blue FGA and (v) phenylazo-diphenylamine, and (b) an admixture containing (i) a cresol/formaldehyde novolak, (ii) a 4-(2-phenyl-prop-2-yl)-phenyl ester of naphthoquinone-(1,2)-diazide-(2)-sulfonic acid-(4), (iii) polyvinyl butyral, (iv) naphthoquinone-(1,2)-diazide-(2)-sulfonic acid chloride-(4) and (v) crystal violet.

6. An offset printing plate as claimed in claim 5, wherein said reproduction layer is comprised of admixture (a).

7. An offset printing plate as claimed in claim 5, wherein said reproduction layer is comprised of admixture (b).

8. A process for manufacturing an offset printing plate comprised of (i) an aluminum or an aluminum alloy substrate and (ii) a radiation-sensitive layer provided on said substrate, comprising the steps of:

(A) roughening said substrate mechanically, chemically and/or electrochemically;

(B) anodically oxidizing said substrate; and then (C) subjecting said substrate to a nonelectrolytic immersion treatment in an aqueous solution which contains between about 3 g/l and 150 g/l of sodium hexametaphosphate and an amount of a water-soluble hydroxycarboxylic acid such that said aqueous solution has a pH of between about 1 and 5, whereby dyestuff adsorption by said substrate is reduced when said radiation-sensitive layer is imagewise exposed and developed.

9. A process as claimed in claim 8, wherein said acid comprises a citric or tartaric acid.

10. A process as claimed in claim 9, wherein said acid comprises a citric acid.

11. A process as claimed in claim 8, wherein step (A) comprises electrochemically roughening said substrate in an aqueous electrolyte solution comprising HCl and/or $HNO_3$.

12. A process as claimed in claim 8, wherein step (B) comprises anodically oxidizing said substrate in an aqueous solution comprising $H_2SO_4$.

13. A process as claimed in claim 8, wherein radiation-sensitive layer is a positive-working or a negative-working radiation layer.

14. A process as claimed in claim 13, wherein said reproduction layer is comprised of an admixture selected from the group consisting of (a) an admixture containing (i) a reaction product of polyvinyl butyral and propenylsulfonylisocyanate, (ii) a polycondensation product obtained from 1 mol of 3-methoxy-diphenylamine-4-diazonium sulfate and 1 mol of 4,4'-bismethoxymethyl diphenyl ether, precipitated as the mesitylene sulfonate, (iii) $H_3PO_4$, (iv) Viktoria Pure Blue FGA and (v) phenylazo-diphenylamine; and (b) an admixture containing (i) a cresol/formaldehyde novolak, (ii) a 4-(2-phenyl-prop-2-yl)-phenyl ester of naphthoquinone-(1,2)-diazide-(2)-sulfonic acid-(4), (iii) polyvinyl butyral, (iv) naphthoquinone-(1,2)-diazide-(2)-sulfonic acid chloride-(4) and (v) crystal violet.

15. A process as claimed in claim 13, wherein said reproduction layer is comprised of admixture (a).

16. A process as claimed in claim 13, wherein said reproduction layer is comprised of admixture (b).

* * * * *